(12) United States Patent
Zhang et al.

(10) Patent No.: US 10,192,474 B2
(45) Date of Patent: Jan. 29, 2019

(54) CONTROLLABLE VOLTAGE SOURCE, SHIFT REGISTER AND UNIT THEREOF, AND DISPLAY

(71) Applicant: PEKING UNIVERSITY SHENZHEN GRADUATE SCHOOL, Shenzhen (CN)

(72) Inventors: Shengdong Zhang, Shenzhen (CN); Congwei Liao, Shenzhen (CN); Zhijin Hu, Shenzhen (CN); Wenjie Li, Shenzhen (CN); Junmei Li, Shenzhen (CN)

(73) Assignee: Peking University Shenzhen Graduate School, Shenzhen, Guangdong (CN)

( * ) Notice: Subject to any disclaimer, the term of this patent is extended or adjusted under 35 U.S.C. 154(b) by 158 days.

(21) Appl. No.: 15/329,143

(22) PCT Filed: Nov. 14, 2014

(86) PCT No.: PCT/CN2014/091062
§ 371 (c)(1),
(2) Date: Jan. 25, 2017

(87) PCT Pub. No.: WO2016/019651
PCT Pub. Date: Feb. 11, 2016

(65) Prior Publication Data
US 2017/0213500 A1     Jul. 27, 2017

(30) Foreign Application Priority Data
Aug. 4, 2014     (CN) .......................... 2014 1 0380566

(51) Int. Cl.
*G11C 19/00*     (2006.01)
*G09G 3/20*     (2006.01)
(Continued)

(52) U.S. Cl.
CPC ............. *G09G 3/2092* (2013.01); *G09G 3/20* (2013.01); *G09G 3/36* (2013.01); *G11C 5/145* (2013.01);
(Continued)

(58) Field of Classification Search
None
See application file for complete search history.

(56) References Cited

U.S. PATENT DOCUMENTS

| 4,802,739 A | 2/1989 | Iwamoto |
| 2008/0036725 A1 | 2/2008 | Lee et al. |

(Continued)

FOREIGN PATENT DOCUMENTS

| CN | 1750073 A | 3/2006 |
| CN | 101261881 A | 9/2008 |

(Continued)

OTHER PUBLICATIONS

International Preliminary Report on Patentability (IPRP; CH 1) for PCT/CN2014/091062 dated Feb. 16, 2017 and its English translation provided by WIPO.

(Continued)

*Primary Examiner* — Tuan T Lam
(74) *Attorney, Agent, or Firm* — Ladas & Parry, LLP

(57) ABSTRACT

A controllable voltage source, comprising a control module (1), a storage module (2) and an output module (3); the control module (1) is coupled between a high level end and a low level end; the storage module (2) comprises a storage capacitor; two ends of the storage capacitor are respectively coupled to the control module (1) to form a first terminal and a second terminal; the output module (3) is coupled to the second terminal, and the signal output end thereof is used to output to an external circuit the voltage signal of the controllable voltage source; the control module (1) responds (Continued)

the effective level of a first clock signal so as to enable the first terminal to be coupled to the high level end, and the first terminal is charged from the high level end; the control module (1) responds the effective level of a second clock signal so as to enable the second terminal to be coupled to the high level end, and the second terminal is charged from the high level end; and the first terminal is coupled to the low level end and discharges via the low level end. The effective level of the first clock signal does not overlap with the effective level of the second clock signal. Also disclosed are a shift register and unit thereof, and display based on the controllable voltage source.

9 Claims, 9 Drawing Sheets

(51) Int. Cl.
| | | |
|---|---|---|
| *G11C 19/28* | (2006.01) | |
| *H02M 3/07* | (2006.01) | |
| *G11C 5/14* | (2006.01) | |
| *G09G 3/36* | (2006.01) | |

(52) U.S. Cl.
CPC ............... *G11C 19/28* (2013.01); *H02M 3/07* (2013.01); *G09G 3/3677* (2013.01); *G09G 2300/043* (2013.01); *G09G 2300/0809* (2013.01); *G09G 2310/0286* (2013.01); *G09G 2330/028* (2013.01)

(56) References Cited

U.S. PATENT DOCUMENTS

| | | | |
|---|---|---|---|
| 2008/0231347 A1 | 9/2008 | Yen et al. | |
| 2010/0207928 A1* | 8/2010 | Lee | ...................... G09G 3/3677 345/213 |
| 2011/0193853 A1 | 8/2011 | Sakamoto et al. | |
| 2012/0169783 A1 | 7/2012 | Park | |
| 2013/0027377 A1 | 1/2013 | Yang et al. | |
| 2014/0093028 A1* | 4/2014 | Wu | .......................... G11C 19/28 377/64 |
| 2017/0352319 A1* | 12/2017 | Ozawa | .................. G09G 3/3648 |
| 2018/0082629 A1* | 3/2018 | Wang | ....................... G09G 3/20 |

FOREIGN PATENT DOCUMENTS

| | | |
|---|---|---|
| CN | 101621248 A | 1/2010 |
| CN | 102005917 A | 4/2011 |
| CN | 102723064 A | 10/2012 |
| CN | 102831867 A | 12/2012 |
| CN | 103077689 A | 5/2013 |
| CN | 103617775 A | 3/2014 |

OTHER PUBLICATIONS

Written Opinion of the International Search Authority for PCT/CN2014/091062 dated Mar. 3, 2015 and its English translation provided WIPO.
International Search Report for PCT/CN2014/091062 dated Mar. 3, 2015 and its English tmnslation provided by WIPO.
Written Opinion of the International Search Authority for PCT/CN2014/091062 dated Mar. 3, 2015 and its English translation provided by Bing Translator.
From CN103617775A, First Office Action dated Aug. 24, 2015, and its English translation from Espacenet.
From CN103617775A, Search Report dated Aug. 14, 2015, and its English translation from Espacenet.
From CN103077689 A, First Office Action dated May 28, 2014, and its English translation from Espacenet.
From CN103077689 A, Second Office Action dated Nov. 27, 2014, and its English translation from Espacenet.
From CN103077689 A, Search Report dated May 20, 2014, and its English translation from Bing Translator.

* cited by examiner

CONTROLLABLE VOLTAGE SOURCE, SHIFT REGISTER AND UNIT THEREOF, AND DISPLAY

CROSS REFERENCE TO RELATED APPLICATIONS

The present application is the U.S. national phase of PCT Application No. PCT/CN2014/091062 filed on Nov. 14, 2014, which claims priority to Chinese Patent Application No. 201410380566.1 filed on Aug. 4, 2014, the disclosures of which are incorporated herein by reference in their entireties.

TECHNICAL FIELD

The disclosure relates to the field of electronic circuits, in particular to a controllable voltage source, shift register and unit, and display.

BACKGROUND

The narrow bezel display technology is gradually becoming the mainstream of flat panel display. TFT integrated driver circuit (Gate-driver on Array, GOA) design is essential for realizing narrow bezel display. Due to adopting of GOA circuit, the number of source and gate driving chips and the related connections be reduced, thus not only the TFT display panel becomes compact and attractive due to significant decrease of bezel size of the display, but also the following module and packaging process can also be simplified. Consequently, the manufacturing cost of the display can be greatly reduced, and the resolution and reliability of the TFT display panel can also be improved.

How to improve its reliability is the key problem in the design of TFT integrated gate driving circuit. For GOA circuits, the TFTs for low-level-holding experience long time stressing with positive gate voltage. Thus the threshold voltage of the low-level-holding TFTs is prone to increase with the operating time. When the threshold voltage shift of the low-level-holding TFTs reaches certain amount, GOA circuits fail. For application of desktop monitor or TV panel, the reliability of TFT integrated line scan driving circuit is prominent particularly due to increased operating time compared with that of other display applications. However, previous designs are mainly focusing on improvements in device characteristic. The reliability of the GOA circuit can be enhanced by suppressing shift of device's electrical characteristics.

In a variety of previous GOA circuits, constant gate biasing mode is popularly used for the low-level-holding TFTs. However, according to the GOA circuit operating principle, constant-biasing method leads to the low-level-holding TFTs biasing with high gate voltage with unnecessarily long operating time, thus the threshold voltage shift of TFT is large and the life of the circuit is difficult to be prolonged.

As showed in the FIG. 14, almost all the GOA circuits include 3 basic modules: input, output and low-level-holding module. The T100 is input device; the T200 is output device, which outputs the line scan pulse signal; the T300 and T400 are low-level-holding devices, whose gate input voltage is high as a constant value. There are usually overlap capacitance between the gate electrode and the source-drain electrode, as $C_{GD}$ of T200 as showed in FIG. 14. During the low level holding period, when clock signal of the T200 drain switches from low level to high level, the voltage potential of gate electrode of T200, which is originally at the low level, will rise due to the coupling of $C_{GD}$. If the feed-through induced voltage-rising trend cannot be well suppressed, T200 will switch to the sub-threshold region or even the on region, which will lead to a very large charging current at the output electrode and the output can't be maintained low. At this time, T300 and T400 are turned on, and the gate of T200 and output electrode can be pulled-down, respectively.

But one of the main problems is that the threshold voltage of TFTs is prone to increases with time under electric stress, which leads to the degradation of the conducting ability. When the threshold voltage increases from the initial value (such as $V_{TH0}$) to a certain critical value (such as $V_{THC}$), T300 and T400 is no longer being able to maintain the low level of gate electrode of T200 and the output, and the circuit starts to malfunction.

According to the operation principle of the mentioned GOA circuit, for normal operating, the gate-to-source over-drive voltage (the difference between the gate-source voltage and the threshold voltage) of T300 and T400 is required to be slightly larger than the difference ($V_{THC}-V_{GL}-V_{GH}$). Here the $V_{GH}$ and $V_{GL}$ represents high/low level of clock signal, respectively, for driving T300 and T400. But in previous GOA circuits, the level of the driving clock signal of the low level holding device is constant. Thus for most time, especially for early operating time, over-drive voltage of T300 and T400 is much greater than the difference ($V_{GH}-V_{THC}-V_{GL}-$). For example, $V_{GH}$, $V_{THC}$, $V_{TH0}$ and $V_{GL}$ are 25V, 20V, 3V, and 0V, respectively. In the early stage of the circuit operating, the required gate over-drive voltage of T300 and T400 is only 5 V, but the actual value of the over-drive voltage ($V_{GH}-V_{TH0}-V_{GL}$) reaches 22 V. Both theoretical and experimental results show that the shift of the threshold voltage accelerates due to the increase of the driving voltage. To sum up, due to the constant biasing method, in the previous GOA circuits, the high level of the clock signal is constant, threshold voltage of relevant TFTs shift too fast and circuit life is difficult to be prolonged.

SUMMARY

This application provides a controllable voltage source, shift register and its unit and a display device, so as to regulate the supply voltage.

According to the first aspect of the disclosure, a controllable voltage source is provided, which includes control module, storage module and output module.

Among them, the control module is coupled between the high voltage level terminal and the low voltage level terminal. And storage module includes storage capacitor. The two terminals of the storage capacitor are coupled with the control module, and the first and the second terminals are formed respectively. And the output module is coupled to the second terminal, and the signal output terminal is used for outputting the voltage signal of the controllable voltage source.

The control module is used to couple the first terminal to the high voltage level according to the effective level of the first clock signal. Thus the first terminal can be charged to the high voltage level.

And the control module is also used to couple the second terminal to the high voltage level according to the effective level of the second clock signal. Thus the second terminal can be charged to the high voltage level. And also the first terminal is coupled with the low level terminal according to the effective level of the second clock signal. Thus the first terminal can be discharged to the low voltage level. The effective voltage level interval for the first and the second clock signal are not overlapped.

According to the second aspect of the disclosure, a shift register is provided, which includes at least one shift register unit, isolation part and the mentioned controllable voltage source.

Among them, shift register unit includes the driving module, which is used for transmitting the first signal to the signal output terminal of the shift register unit through the state switching.

Input module is used for controlling the switching state of the driving module.

The low-level-holding module is used for maintaining the low level of signal output terminal after the shift register unit outputs scanning signals through state switching.

The signal output terminal of the controllable voltage source is coupled to the enabling terminal of the low-level-holding module.

The supplied voltage level to the enabling terminal of the low-level-holding module can be adjusted by the controllable voltage source.

According to the third aspect of the disclosure, a display device is provided, which includes:

a two-dimensional pixel array comprising a plurality of pixels, wherein data lines in a first direction and scanning lines in a second direction connected with each pixel in the array;

data signals are provided to data lines by data driving circuits;

gate driving signal is provided to gate scanning lines by gate driving circuit; and gate driving circuits is composed of the above mentioned shift registers.

The beneficial effect of the present application is, the supplied voltage of the controllable voltage source can be adjusted by changing the duty cycle and amplitude of the first clock signal and/or the second clock signal, or timing sequence of the first and the second clock signal. Therefore, the circuit performance degradation, which is caused by long operating time, or the environment temperature change, can be well compensated.

In the shift register proposed in this disclosure, the supplied voltage for low-level-holding devices can be adjusted by the controllable voltage source. Consequently, the threshold voltage shift of the low-level-holding TFTs can be compensated, and the lifetime of the gate driver can be prolonged.

DETAILED DESCRIPTION

In the following, detailed description will be further provided with specific embodiment and attached diagrams.

First, some terms is explained. And in this application, the following mentioned switching tubes refers to transistors.

The transistors in this application may be bipolar junction transistors or field effect transistors. When the transistor is bipolar junction transistor, the control electrode is the base electrode, and the first electrode can be collector or emitter electrode of bipolar junction transistor, and the second electrode corresponding is emitter or collector electrode of bipolar junction transistor. In the case of field effect transistor, the control electrode is gate electrode, and the first electrode is drain electrode or source electrode, correspondingly the second electrode is source electrode or drain electrode. In display application, typically a field effect transistor is used, that is thin film transistor (TFT). A detailed description of the application is given, and the field effect transistor is taken as an example, in other embodiments, the transistor may also be bipolar junction transistor.

Overlapping means that, there is specific time at least, two signals are both at the effective voltage level. Thus non-overlapping means that two signals are not at the effective voltage level in any time.

Here effective voltage level can be either high level or low level. In the following embodiments, effective voltage level means high level.

Figure 1:
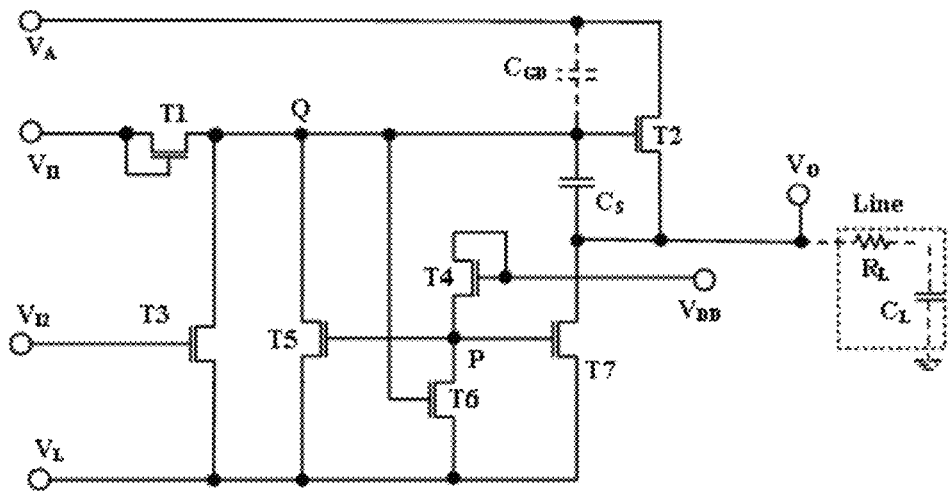
FIG. 1 is the structure diagram of the previous shift register unit circuit.

As shown in FIG. 1, the shift-register unit is taken an example to illustrate the thoughts of the disclosure. The logical function of the conventional shift register unit is realized by T1~T7. In the low level holding phase, after the enabling signals are received by T5 and T7, the output terminal and control terminal Q can be pulled down to the low level, i.e. $V_L$.

Usually the enable signal of low-level-holding module (i.e. P) is high level (provided by $V_{DD}$). Thus there is threshold voltage shift in the case that T5 and T7 are biased with high voltage for long operating time. Considering the threshold voltage shift of T5 and T7, the level of enable signal of the low-level-holding module should be adjusted accordingly, so as to maintain the low level of output terminal and control terminal Q of the shift register unit.

Based on these, a controllable voltage source is disclosed in the presented embodiments, which can adjust the voltage of the enabling terminal of the low-level-maintaining module. The specific implementation is described with concrete examples.

First Embodiment

Figure 2:
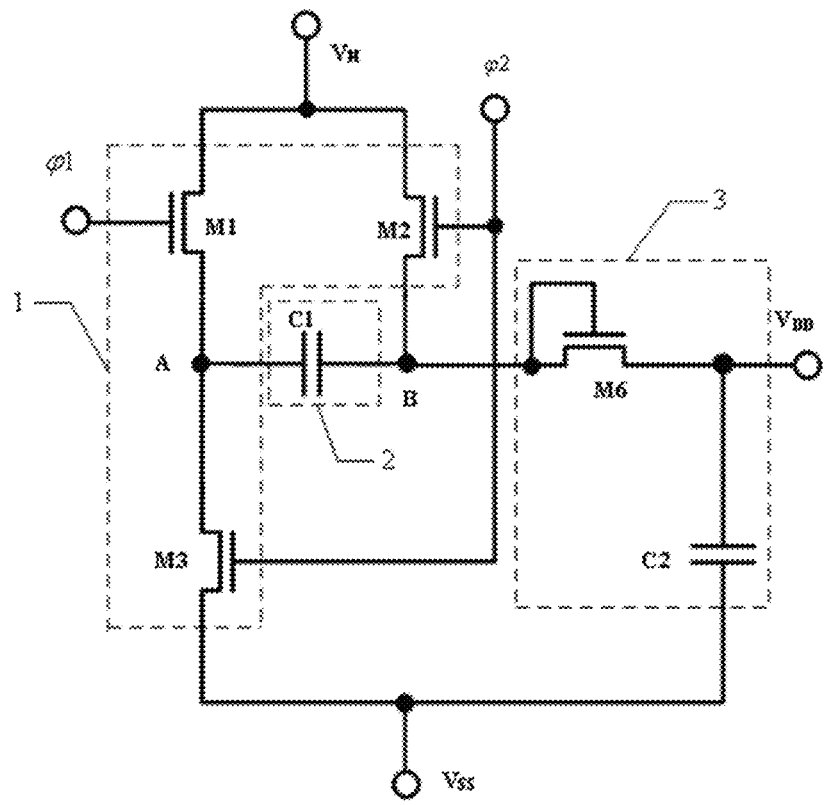
FIG. 2 is the structure diagram of disclosed controllable voltage source of the first embodiment.

Based on the above mentioned schematic, as shown in FIG. 2, an adaptable voltage source is disclosed, which include control module 1, storage module 2 and output module 3.

The control module 1 is coupled between the high voltage level terminal and the low voltage level terminal.

The storage module 2 includes a storage capacitor C1, which is coupled to the control module 1, and the first terminal A and the second terminal B are formed respectively.

The output module 3 is coupled to the second terminal B, and the signal output terminal of the output module is used to provide the controllable voltage source $V_{DD}$ for external circuits.

In response to the first clock signal φ1, control module 1 is used to couple the first terminal A with the high voltage level terminal. Thus the first terminal A can be charged with high voltage level.

Control module 1 is also used to couple the second terminal B with the high voltage level terminal according to the effective voltage of the second clock signal φ2. Thus the second terminal B can be charged with high voltage level. And the control module 1 can also used to couple the first terminal A with low voltage level, and the first terminal A can be discharged with low voltage level.

Among them, the effective voltage level of the first clock signal φ1 and the second clock signal φ2 are non-overlapped.

In a specific embodiment, control module 1 includes the first transistor M1, the second transistor M2 and the third transistor M3. Both the first electrode (e.g. the drain electrode) of the first transistor M1 and the first electrode (e.g., the drain electrode) of the second transistor M2 are coupled with the high voltage level. And the second electrode of the first transistor M1 (e.g. source electrode) and the second electrode of the second transistor M2 (e.g. source electrode) are coupled to the storage capacitor C1 are respectively, and the first terminal and the second terminal A and B are formed consequently. The control electrode of the first transistor M1 (e.g. the source gate) is used to input the first clock signal φ1. And control electrode of the second transistor M2 (for example, the source gate) for the input of the second clock signal φ2.

The output module 3 includes a sixth transistor M6. The first electrode (e.g. drain electrode) and the control electrode (e.g. gate electrode) of the sixth transistor M6 are coupled to the second terminal B. And the second electrode of the sixth transistor M6 (e.g. source electrode) is used as signal output terminal of the output module 3.

In order to filter the output voltage of the output module 3, in the preferred embodiment, the output module 3 can further include a filter capacitor C2. And the first terminal of the filter capacitor C2 is coupled with the second electrode of the sixth transistor M6. And the second electrode of the filter capacitor C2 is coupled to the low voltage level.

In a preferred embodiment, the output module 3 may further include a seventh transistor M7. And the first electrode of the seventh transistor M7 (e.g. drain electrode) is coupled with output terminal of the output module 3. And the second electrode of the seventh transistor M7 (e.g. source electrode) is coupled with low voltage level, and the control electrode of the seventh transistor M7 (e.g. gate electrode) is coupled with the pull-down control signal. According to effective voltage of the pull-down control signal, the seventh transistor M7 will be turned on, and the output terminal of the output module 3 can be coupled with low voltage level. Consequently, in the case the controllable voltage source is selected, the output terminal of the output module 3 can be maintained at the low voltage level $V_{SS}$.

In this example, the potential for the high voltage is $V_H$, and the potential for the low level is $V_{SS}$.

Figure 3:
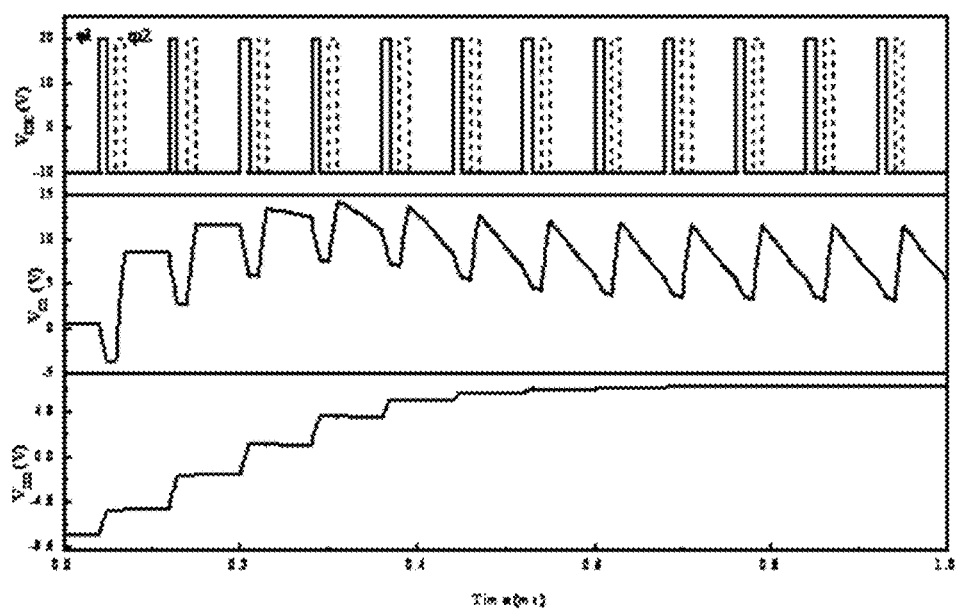
FIG. 3 is the SPICE simulation results of the controllable voltage source of the first embodiment.

FIG. 3 is the SPICE simulation results of the operating timing diagram of the controllable voltage source (In FIG. 3, $V_{CK}$ stands for the first clock signal φ1 and the second clock signal φ2. The solid line is the first clock signal φ1, and the dashed line is the second clock signal φ2). The amplitude of the output signal can be adjusted according to the bootstrapping principal, and the operating procedures are as follows.

(1) Charge Storage Stage

In the early stage of the controllable voltage source, when the second clock signal φ2 is high voltage level, and the first clock signal φ1 is with low voltage level, then the first transistor M1 is turned off, and the second transistor M2 and the third transistor M3 are turned on. Thus, the first terminal A of the storage capacitor C1 is pulled down to the low voltage level VSS, and the second terminal B of the storage capacitor C1 is pulled up to the high level voltage $V_H$. Therefore, voltage difference $V_H$–$V_{SS}$ can be stored in the storage capacity of C1 in the direction of B-A. But due to the limited high level time of the clock signal (such as φ2), and the TFT conduction capacity is limited, the actual voltage stored in the storage capacitor C1 is $V_{C1}$=ΔV, and ΔV is less than $V_H$–$V_{SS}$.

(2) Voltage Bootstrap Stage

In the early stage of the controllable voltage source, when the second clock signal φ2 is low voltage level, and the first clock signal φ1 is with high voltage level, then the first transistor M1 is turned on, and the second transistor M2 and the third transistor M3 are turned off. Thus, the first terminal A of the storage capacitor C1 is pulled up to a high level voltage $V_H$. Because the storage capacitor C1 in the previous stage has been charged with a high voltage in the B-A direction, the second terminal B of C1 is bootstrapped to ΔV+$V_H$.

It is worth noting that, in the voltage bootstrap phase, the sixth transistor M6 is also turned on. So charges in the storage capacity C1 can be transferred to the output terminal $V_{DD}$ through the sixth transistor M6, and loading capacitance at $V_{DD}$ can be charged. The charging process only take place in the condition that the second terminal B of storage capacitance C1 is raised to a higher potential, and the sixth transistor M6 is turned on. Thus, as shown in FIG. 3, the voltage difference on the storage capacitor C1 is decreased during the voltage bootstrap stage. Therefore, in the voltage bootstrap stage, the output potential of the controllable voltage source $V_{DD}$ is raised approximately linearly.

(3) Stable Voltage Output Stage

The output voltage of the controllable voltage source signal $V_{DD}$ can gradually reach the steady-state value, as the two processes mentioned above need a number of cycles to take place, and the two processes include, (1) the charge storage phase, and (2) the voltage bootstrapping phase. The increase of voltage level of the storage capacitor C1 for the high level interval of the first clock signal φ1 can gradually equal to the decrease of the second clock signal φ2. Thus, although voltage level of terminals A and B of the storage capacitor C1 are still switching between the different levels due to charge and discharge procedures, but the voltage value of storage capacitor C1 is relatively stable, and stability of the output voltage can also be guaranteed.

For the controllable voltage source of this embodiment, amplitude of the output voltage signal $V_{DD}$ can be adjusted by changing duty ratio, amplitude and timing of the first clock signal φ1 and/or second clock signal φ2. For example, the amplitude of the output voltage signal $V_{DD}$ can be reduced by decreasing duty ratio of the first clock signal φ1 and second clock signals φ2. And the amplitude of the output voltage signal $V_{DD}$ can also be reduced by decreasing the voltage amplitude of the first clock signal φ1 or second clock signal φ2. The controllable voltage source circuit is composed of TFTs, thus the controllable voltage source can be integrated with line scan driving circuit and TFT arrays on the same substrate.

Advantages of this controllable voltage source circuit include, saving of the pulse width control integration circuit (IC) of the external voltage source, and reduction of the high power supply voltage at the interface. Thus electromagnetic interference on the interface can be suppressed. At the same time, the output voltage provided to the external circuit can be adjusted, which can compensate the circuit performance degradation caused by the long operating time, or the environment temperature changes. Taking the environment temperature change as an example, the conduction current of TFT a-Si and other transistors is reduced due to the decrease of the effective mobility and the increase of the threshold voltage. Thus driving capability of TFTs is degraded. In order to compensate the circuit performance degradation due to temperature changes, by increasing of duty ratio and frequency of the first clock signal φ1 and/or the second clock signal φ2, higher output driving voltage can be provided to the external TFT circuit. Thus the circuit performance can be maintained, and the circuit system can work properly even in harsh environments with low temperature.

Second Embodiment

The disclosed controllable voltage source of the first embodiment can sense the characteristics of the TFT, such as the threshold voltage shift of the circuit, or the change of the current-voltage characteristics due to temperature change. According to the characteristic of TFT, the output of the controllable voltage source will be adjusted. Consequently, the overall driving system can be adjusted according to the change of the TFT characteristic, and the controllable voltage source can be biased with dynamic biasing voltages.

Figure 4:
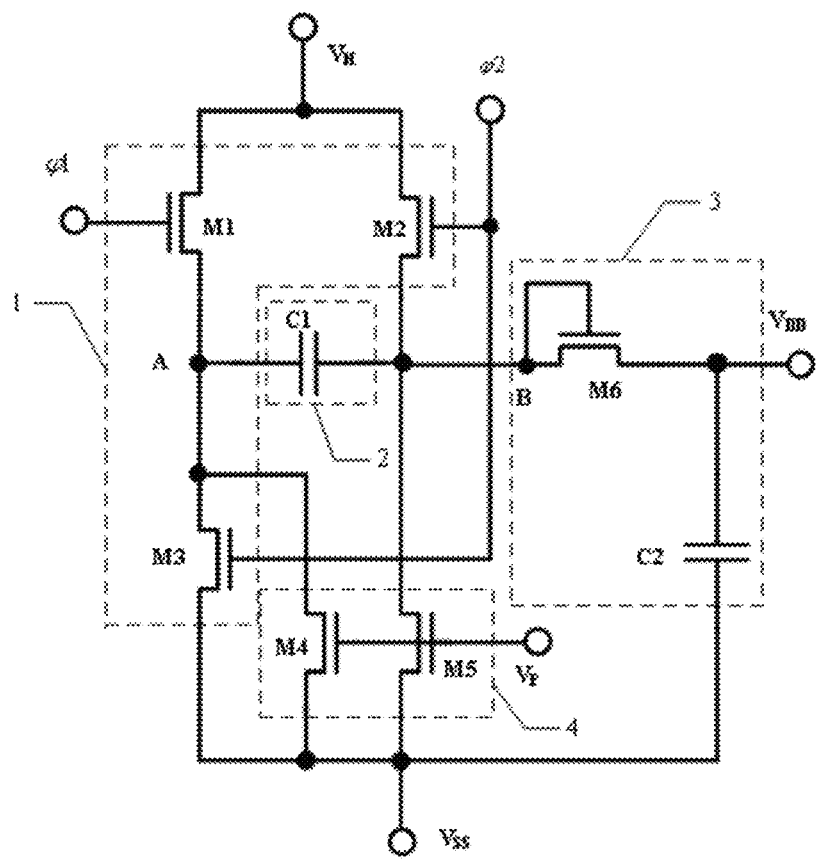
FIG. 4 is structure diagram of the disclosed controllable voltage source of the second embodiment.

In the following, sensing of threshold voltage of the to-be-detected device of external circuit is taken as an example. As shown in FIG. 4, structure diagram of the controllable voltage source circuit is disclosed. Being different with the first embodiment, the second embodiment also include threshold voltage modulation module 4. The threshold modulation module 4 is connected with the first terminal A and the second terminal B respectively. Threshold modulation module 4 is also coupled with low voltage level. Sensing terminal of threshold modulation module 4 is coupled with to-be-detect device of the external circuit, and threshold voltage of the to-be-detect device can be sensed and feedback to the first terminal A and/or the second terminal B.

In a specific embodiment, threshold modulation module 4 includes a fourth transistor M4 and a fifth transistor M5. The first electrode of the fourth transistor M4 (e.g. drain electrode) is coupled to the first terminal A, and the second electrode (e.g. source electrode) is coupled with the low voltage terminal. And the first electrode of the fifth transistor M5 (e.g. drain electrode) is coupled with the second terminal B, and the second electrode (e.g. source electrode) is coupled with low voltage level. And control electrode of M4 (e.g. gate electrode) and control electrode of fifth transistor M5 (e.g. gate electrode) are coupled and sensing node is formed.

In other embodiments, threshold modulation module 4 can also b e achieved through other means, such as optcoupler.

Operating procedure of the disclosed controllable voltage source of the second embodiment is similar to that of the first embodiment, and details are omitted here.

It is worth pointing that, in the above operating process, the voltage $V_{C1}$ of the storage capacitor C1 can also be modulated by the fourth transistor M4 and fifth transistor M5, for the afore mentioned charge storage and bootstrapping phase. As control electrodes of the M4 and M5 (i.e. gate electrodes) is coupled with an element to be sensed (for example, being coupled to the control electrode of a transistor to be sensed), thus threshold voltage shift of the element to be sensed can be sensed by M5 and M4. With the increase of circuit's operating time, $\Delta V_{TH}$ of M4 and M5 is increased, thus their conducting ability decays. Therefore, due to the threshold voltage shift, increased voltage can be stored at the storage capacitor C1 between the first terminal A and second terminal B, and $V_{C1}$ loss for the voltage bootstrapping stage can also be decreased. For the above two reasons, with the threshold voltage shift, the output voltage of the controllable voltage source VDD will be increased accordingly.

Figure 5:
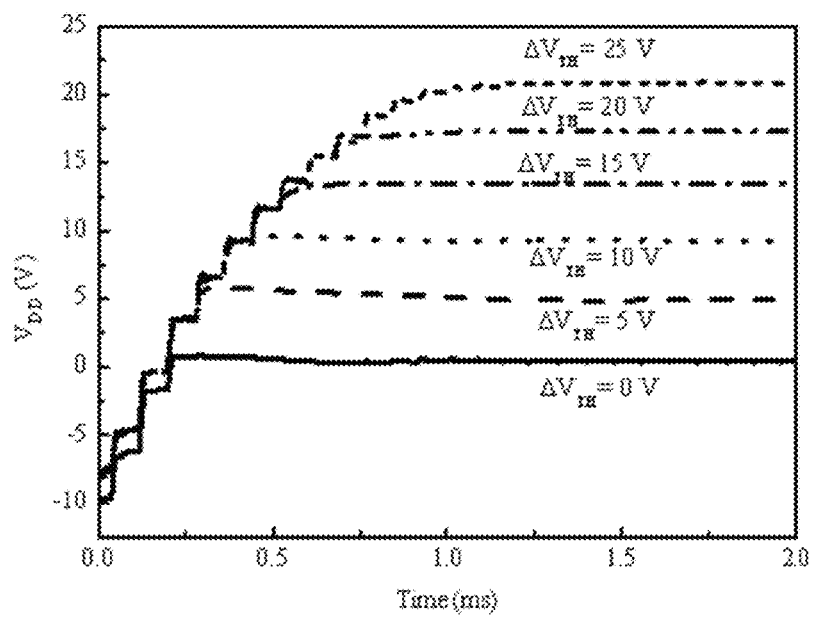
FIG. 5 is the SPICE simulation results of the controllable voltage source with adaptive biasing of the second embodiment.

FIG. 5 shows the SPICE simulation results of controllable voltage source with adaptive biasing for this embodiment. With the increase of $\Delta V_{TH}$ from 0V to 25V, the value of $V_{DD}$ can be increased from 0V to 22V correspondingly. It is proved that operating principal of the proposed voltage source is correct, and the linearity of the threshold voltage response is good. It is worth noting that the compensation ratio of modulated $V_{DD}$ to $\Delta V_{TH}$ did not reach 100%. According to the SPICE simulation, the compensation rate is approximately 88%. This means that for the TFT integrated circuit (such as the shift register), there is still a certain driving ability degradation in its to-be-sensed components (such as the pull-down transistors). However, compared with constant voltage driving mode, the disclosed controllable voltage source can sense the threshold voltage shift of the to-be-detect element, and the output voltage signal can be adjusted accordingly. The lifetime of this self compensation circuit will be greatly extended.

Third Embodiment

Figure 6:
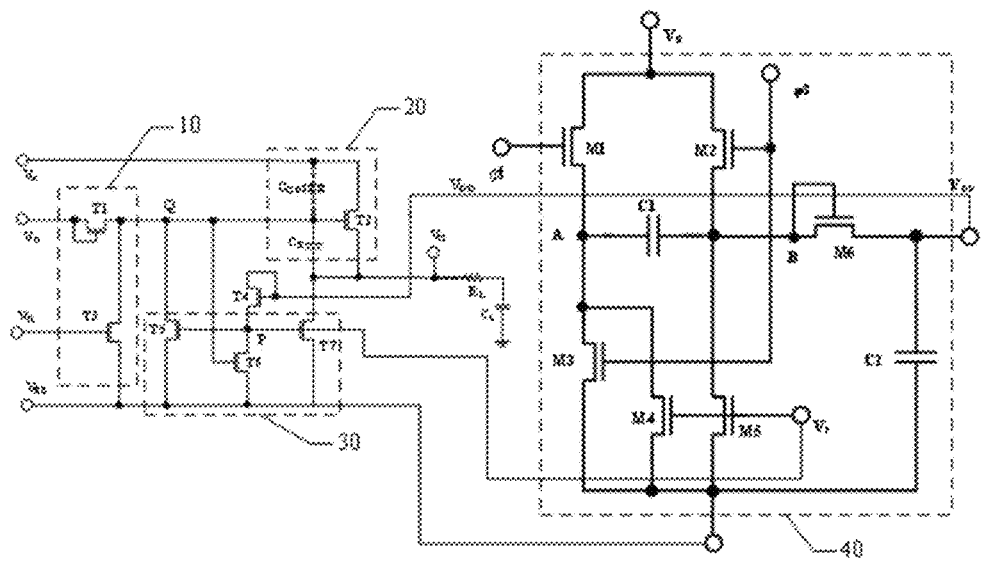
FIG. 6 is the structure diagram of disclosed shift register unit circuit of the third embodiment.

The above disclosed controllable voltage source is suitable for any equipment circuit that are requiring power supply voltage, and the shift register unit is taken as an example for further discussions. As shown in FIG. 6, the structure diagram of the disclosed shift register is provided. The shift register unit includes a drive module 20, an input module 10, a low-level-maintaining module 30, and a controllable voltage source 40.

Among them, the driving module 20 is used for transmitting the first signal $V_A$ to the signal output end of the shift register unit through state switching. After the Q node is charged with driving voltage, the first signal $V_A$ can be transferred to the signal output end of the shift register unit. In specific embodiment, the drive module 20 includes transistor T2, which is coupled to the signal output end of the shift register unit, and the storage capacitor Cs, which is used for charge storing of driving control terminal Q. And in other embodiments, the drive module 20 can also be implemented with other existing driving mode.

Input module 10 is used to control the switching status of the drive module 20. For example, the first pulse signal $V_{I1}$ can be provided to the first pulse signal input terminal, and Q node of driving module 20 can be charged. And the second pulse signal $V_{I2}$ can also be provided to the second input pulse terminal. Thus the signal output terminal and driving-control terminal Q can be coupled with low voltage level. In one specific embodiment, the input module 10 may include the first transistor T1, which is used for receiving the first pulse signal $V_{f1}$, and the third transistor T3, which is used for receiving the second pulse signal $V_{f2}$. In other embodiments, input module can also be implemented with other existing modes.

Through state switching, the low-level-holding module 30 is used for maintaining the low level of driving module 20 after scanning signals are generated for the shift register circuit. After enable terminal of low-level-holding module obtains the enable signal $V_P$, both the signal output terminal and driving-control terminal Q are coupled with low voltage level. In the present embodiment, the mentioned enable signal $V_P$ is at high level.

In one specific embodiment, the low level maintenance module 30 include transistor T5 and T7. And the control electrode of T5 (e.g. gate electrode) and the control electrode of T7 (e.g. gate electrode) are coupled with low-level-maintaining enable terminal P. And control electrode of T5 (e.g. gate electrode) and the second electrode of T7 (e.g. source electrode) are couple with low voltage level. And the first electrode of T5 (e.g. drain electrode) is coupled to the drive-control terminal Q. And the first electrode of T7 (e.g. drain electrode) is coupled with the output terminal of the shift register unit. Of course, in other embodiments, transistor T6 can be further coupled between the low-level-maintaining enable terminal P and low-level terminal. The control electrode of T6 (e.g. gate electrode) is coupled to the drive-control terminal Q, thus T5 and T7 can be turned off during the bootstrap phase. In other embodiments, the low-level-holding modules can also be implemented with other existing modes.

It needs to address that, the above mentioned various modules are only taken as examples to illustrate the operating principal of the shift register units. And each module can be realized with other existing technical scheme. And some details have not been described. The interconnections of these modules can be realized according to the existing shift register schematics by ordinary technical personnel in the field. Of course, in the existing technology, in order to filter the output signal $V_O$ of the shift register unit end, capacitor $C_L$ and resistance $R_L$ can be coupled with $V_O$.

The signal output terminal of the controllable voltage source 40 is coupled with the enable terminal of the low voltage level maintaining module 30. Thus the enable terminal of the low voltage level maintaining module can be powered and adjusted by the controllable voltage source 40.

The threshold voltage of low level maintenance module 30 (such as transistors T5 and T7) will increase after long operating time. Thus over-drive voltage of T5 and T7 will be reduced, or in other words, the over-driving ability of T5 and T7 will be decreased. Therefore, in order to detect the threshold voltage of low-level-maintaining module 30, it is preferred that threshold voltage modulation module 4 can be further included in controllable voltage source 40, for dynamic adjusting of the supplied voltage to the low-level-maintaining module 30. The sensing terminal of the threshold modulation module 4 is coupled with the enable terminal of low-level-maintaining module 30. Thus the threshold voltage of low-level-maintaining module 30 can be sensed by the controllable voltage source, and the enable terminal P can be biased according to the dynamically changing threshold voltage.

It should be explained that, both the signal output terminal and the sensing terminal of the controllable voltage source 40 are coupled with the same port of the shift register unit, which is the enable terminal of the low-level-maintaining module. In order to prevent side effect caused by the unstable signal from the shift register unit, it is suggested that isolation module can be inserted between the signal output terminal of the controllable voltage source and the enable terminal of the low-level-maintaining node P. The isolation module can be realized by capacitance, inductance, transformer or other means. In the preferred embodiment, the isolation module includes a transistor T4. Transistor T4 is coupled between the output terminals of the controllable voltage source and enable terminal of low-level-holding module. More specifically, the second electrode of T4 (e.g. source electrode) is coupled to the enable terminal P of low-level-maintaining module. And the first electrode (e.g. drain electrode) and control electrode (e.g. gate electrode) are coupled to the output terminal of the controllable voltage source. The transistor T4 is used to transmit the adaptive voltage $V_{DD}$ to the enable terminal P of the low-level-holding module.

It is preferred that the required clock signals for the shift register unit have the same clock cycle. The first and second clock signal for the controllable voltage source can also be provide by any non overlapped clock signals of the shift register unit. In this embodiment, for the low level holding period, the level of high voltage terminal of voltage source should be maintained at VH. And VH can be provided by external voltage source, voltage source of shift register circuit, or other methods.

Figure 7:
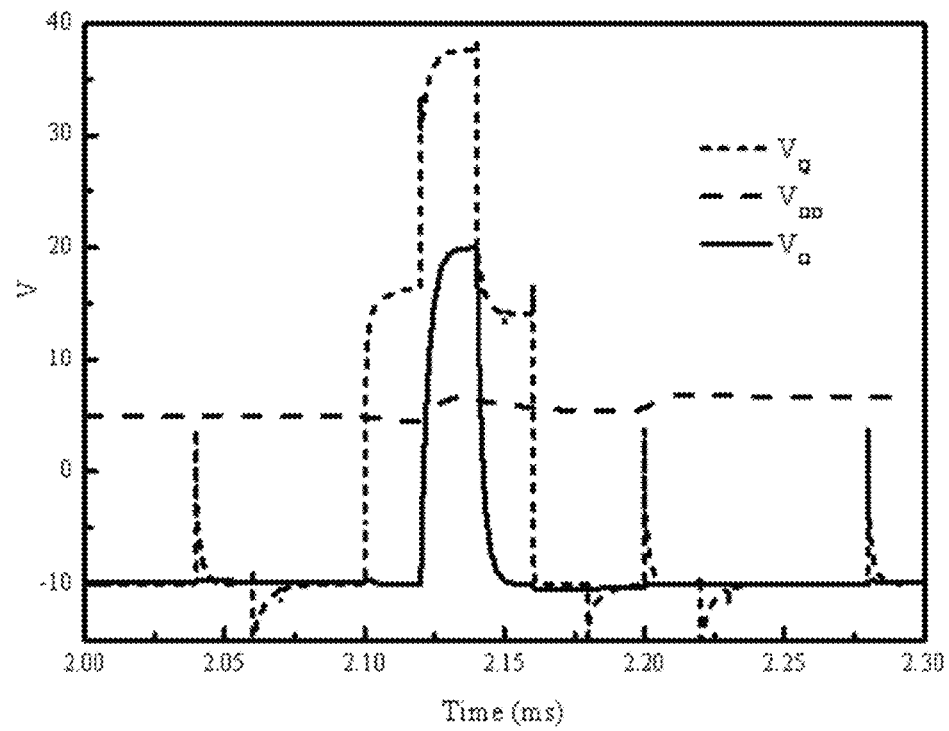
FIG. 7 is the SPICE simulation result of the shift register unit of the third embodiment.

FIG. 7 shows the SPICE simulation results for the shift register unit of this embodiment. And the voltage level of control terminal Q for the shift register unit, and the enable terminal P, and output terminal are represented by $V_Q$, $V_P$, and $V_O$, respectively. The simulation results verify that functions of the designed TFT integrated shift register unit circuit is correct. It is worth noting that, in the process that control terminal Q are bootstrapped or voltage coupled, the controllable voltage source might be affected, and voltage feed through effect might be caused. But the $V_{DD}$ port of all shift register units can be connected in parallel, so the storage capacitor in the $V_{DD}$ port is large. Due to filtering function of the capacitor, voltage feed-through effects can be suppressed.

By adopting the mentioned controllable voltage source, voltage of enable terminal $V_P$ of low-level-holding module of shift register unit can effectively regulated. Thus threshold voltage shift of the low-level-holding module can be effectively compensated, and lifetime of the transistors can be prolonged.

Fourth Embodiment

Figure 8:
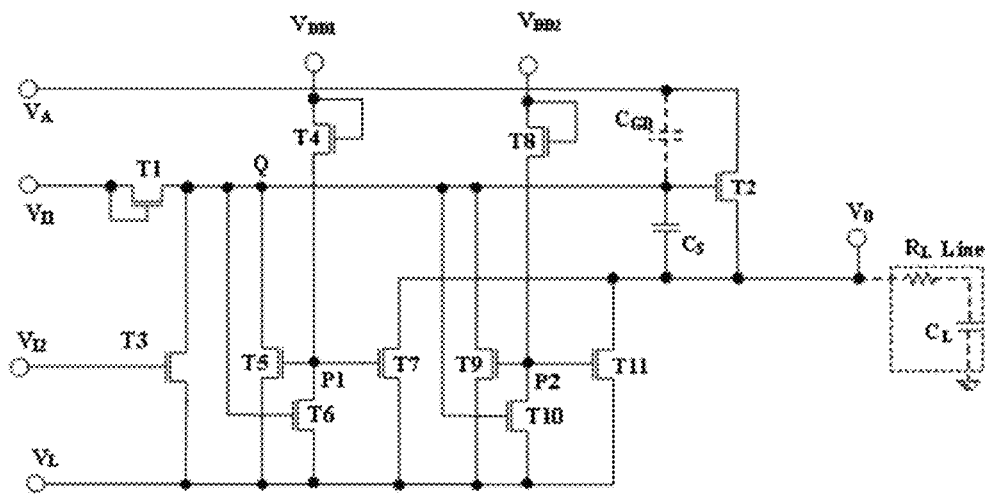
FIG. 8 is structure diagram of the disclosed shift register unit of the fourth embodiment.

In general, it is preferred that two sets of low-level-holding modules are provided for shift register unit, thus output terminal of shift register unit can be maintained at low voltage level alternately. FIG. 8 shows the structure diagram of the shift register unit circuit of the presented embodiment. Compared with the third embodiment, there are two low-level-holding modules in parallel for the presented embodiment.

The first low-level-holding module includes transistor T5, T6 and T7. The control electrode of T5 (e.g. gate electrode) and gate electrode of T7 (e.g. gate electrode), and the first electrode of T6 (e.g. drain electrode) are coupled together, and enable terminal P1 for the first low-level-holding module is formed. And the first electrode of T5 (e.g. drain electrode) is coupled with driving-control terminal Q. The second electrode of T5, T6 and T7 (e.g. source electrode) are coupled together to the low level. And the second low-level-holding module includes T9, T10 and T11. The control electrode of T9 (e.g. gate electrode), and control electrode of T11 (e.g. gate control electrode), and the first electrode of T10 (e.g. drain electrode) are coupled together, and the enable terminal P2 of the second low-level-holding module is formed. The first electrode of T9 (e.g. drain electrode) is coupled to drive-control terminal Q. The second electrode of T9, T10 and T11 (e.g. source electrode) are coupled with low level terminal. In the presented embodiment, two controllable voltage sources with the same circuit structure are used. And output terminals of the two controllable voltage source are coupled with P1 and P2 respectively, for providing power to the low-level-holding modules.

Of course, in the preferred embodiment, the threshold voltage of the two low-level-holding modules can also be sensed by the controllable voltage source respectively. According to the description of the third embodiment, an isolation module can be serially placed between the signal output terminal of the controllable voltage source and enable terminal of the low-level-holding module.

Therefore, in the preferred embodiment, the first low-level-holding module also includes transistors T4. The control electrode (e.g. gate electrode) and the first electrode (e.g. drain electrode) of T4 are shorted and coupled to the first signal output terminal of the controllable voltage source. Thus output voltage $V_{DD1}$ for the first controllable voltage source can be received by T4. And the second electrode of T4 (e.g. source electrode) is coupled to the enable terminal P1 of the first low-level-holding module. And the second low-level-holding module also includes transistors T8. The control electrode (e.g. gate electrode) and the first electrode (e.g. drain electrode) of T8 are shorted and coupled to the signal output terminal of the second controllable voltage source. Thus the output voltage $V_{DD2}$ for the second controllable voltage source can be received. The second electrode of T8 (e.g. source electrode) is coupled to the enable terminal of the second low-level-holding module.

Figure 9:
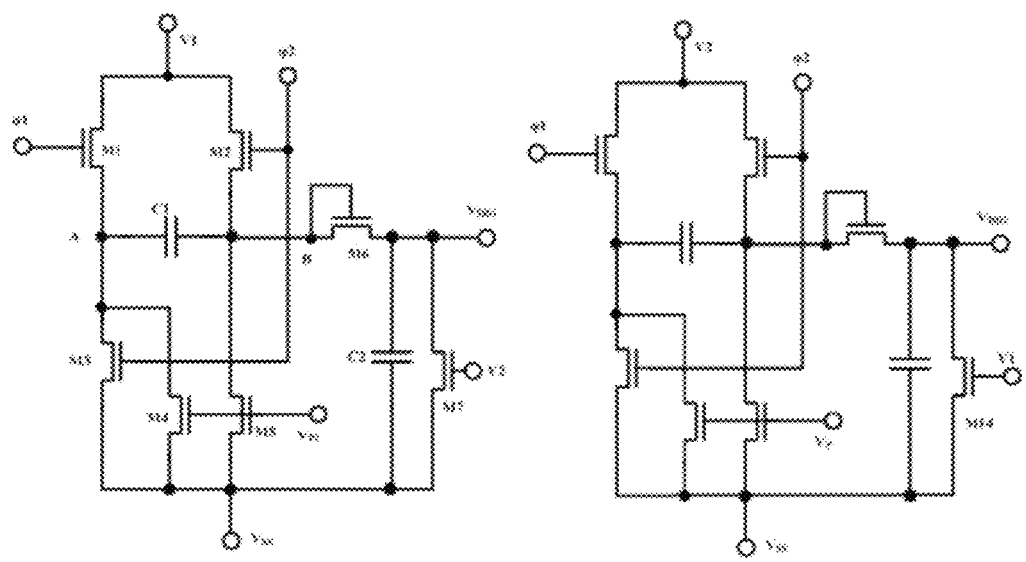
FIG. 9 is structure diagram of the controllable voltage source of the disclosed fourth embodiment.

Among them, the cycle of the output voltage signal $V_{DD1}$ of the first controllable voltage source, and that of the output voltage signal $V_{DD2}$ of the second controllable voltage source, are much greater than clock signal cycle of the shift register unit circuit. As shown in FIG. 9, schematic of the two adaptive control voltage sources are based on capacitance bootstrapping principal. $V_{DD1}$ and $V_{DD2}$ can be generated by the afore mentioned embodiment of controllable voltage sources. The operation principle has already illustrated and details are omitted here.

The main difference between the $V_{DD}$ generating circuit as shown in FIG. 9 and afore mentioned $V_{DD}$ generating circuit lies in that, output electrode of the two controllable voltage sources, i.e. V1 and V2, are complimentary low frequency signals instead of DC voltage. So in the case V1 is with high voltage level, the level of V2 is low, and the output voltage of $V_{DD1}$ is high and the output voltage $V_{DD2}$ is low. Thus the first low-level-holding module of the shift register unit circuit is working, and the second low-level-holding module is idle. On the contrary, if the level of V1 is low, then V2 is with high level voltage, and the level of $V_{DD1}$ is low and the level of $V_{DD2}$ is high. Thus, the first low-level-holding module of the shift register unit circuit is idle, and the second low-level-holding module is working.

Of course, in the preferred embodiment, the output module of the two controllable voltage sources should include reset transistors, such as the seventh transistor M7 and a fourteenth transistor M14 as shown in FIG. 9. And the coupling method of the fourteenth transistor M14 is similar to that of the seventh transistor M7 and details are omitted here. Among them, M7 is used to pull-down $V_{DD1}$ to a low level voltage $V_{SS}$ in accordance with effective voltage of the control electrode (e.g. gate electrode). Similarly, M14 is used to pull-down $V_{DD2}$ to low voltage $V_{SS}$ in accordance with effective voltage of the control electrode (e.g. gate electrode).

It needs to be addressed that, because the effective level is preferably a high level, and V1 and V2 are complementary, it is preferred that V2 is used as pull-down control signal of the seventh transistor M7. In other words, the control electrode of the seventh transistor of M7 (e.g. gate electrode) is connected with V2. While the pull-down control signal for M14 is preferably V1, i.e. the control electrode of M14 (e.g. gate electrode) is V1. Thus it can be guaranteed that when output terminal of the controllable voltage source $V_{DD1}$ (or $V_{DD2}$), the other controllable voltage source is idle and $V_{DD2}$ (or $V_{DD1}$) will be pulled down to the low voltage level.

Figure 10:
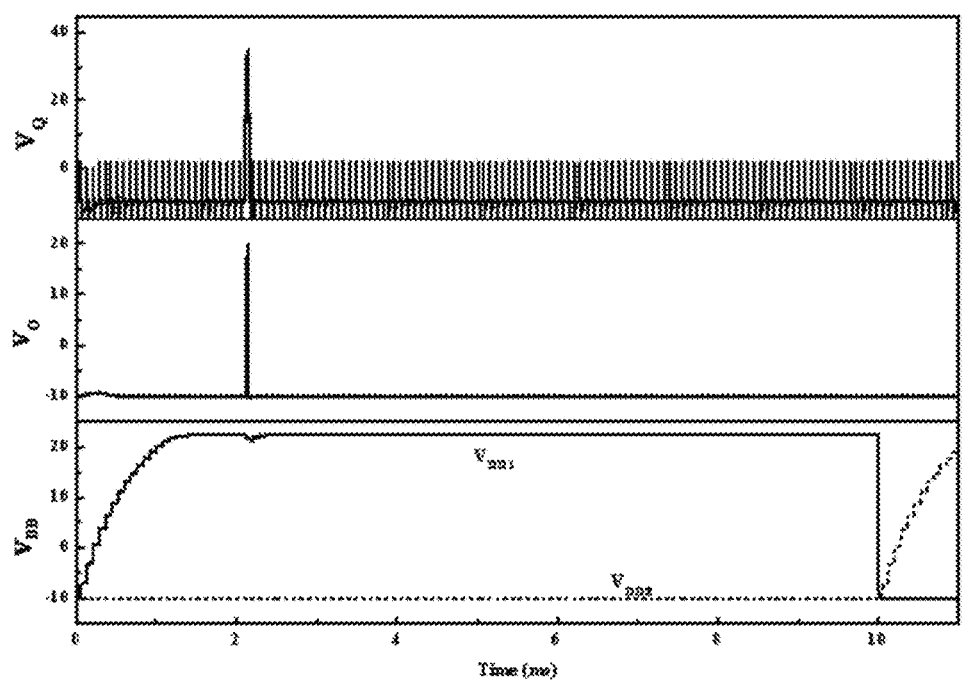
FIG. 10 is the SPICE simulation result of the of the shift register unit of the fourth embodiment.

FIG. 10 shows the SPICE simulation results of a shift register unit. And the period of V1 and V2 is 20 ms. And accordingly, the voltage level of $V_{DD1}$ and $V_{DD2}$ change after working time of 10 ms, thus the operating state of the two low-level-holding modules switches. It is worth noting that, in practical applications, the cycle of V1 and V2 can be further extended, so the switching frequency of $V_{DD1}$ and $V_{DD2}$ is lower.

In the case that the operating frequency of $V_{DD1}$ and $V_{DD2}$ is decreased, the beneficial effects are as follows.

1) The clock feed through effect can be better suppressed by the low-level-holding modules, so the noise voltage at output electrode is smaller. This is mainly because control terminal Q of the shift register can be better maintained at low voltage level $V_{SS}$. Even the clock signal $V_A$ is switch periodically, the potential of control terminal Q is not disturbed. Thus the transistor T2 can be maintained OFF, and the noise voltage can be decreased.

2) The enable terminal P1 of the first low-level-holding module and enable terminal P2 of the second low-level-holding are with pulse voltage driving mode. In other words, the two low-level-holding modules can be turned on alternately. Therefore, threshold voltage shift of TFTs of the low-level-holding module can be decreased due to low frequency pulse biasing mode. In addition, over-drive voltage decrease due to threshold voltage shift can be compensated by controllable voltage source. Due to these reasons, lifetime of the row driving circuit can be further extended.

3) The dynamic power consumption can be decreased as signal switching frequency can be decreased in the case low-level-holding module is biased with low frequency pulse mode. Thus the power consumption of the shift register unit can be reduced.

Figure 11:
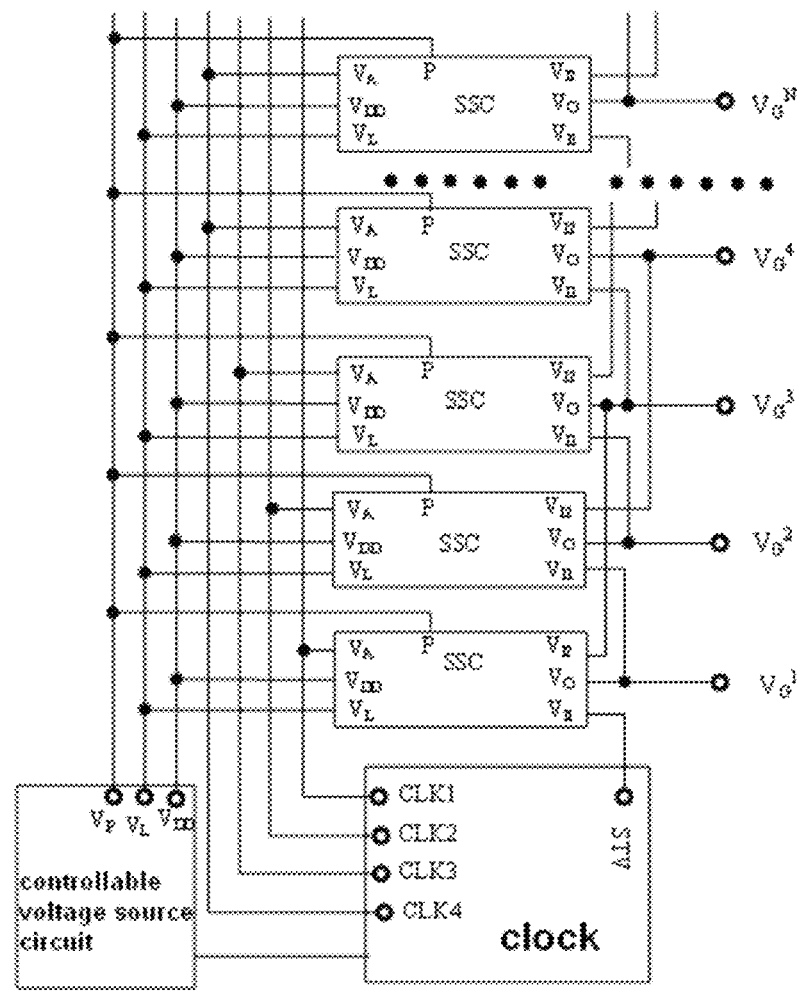
FIG. 11 is the structure diagram of the shift register circuit of the disclosed fourth embodiment.
Figure 12:
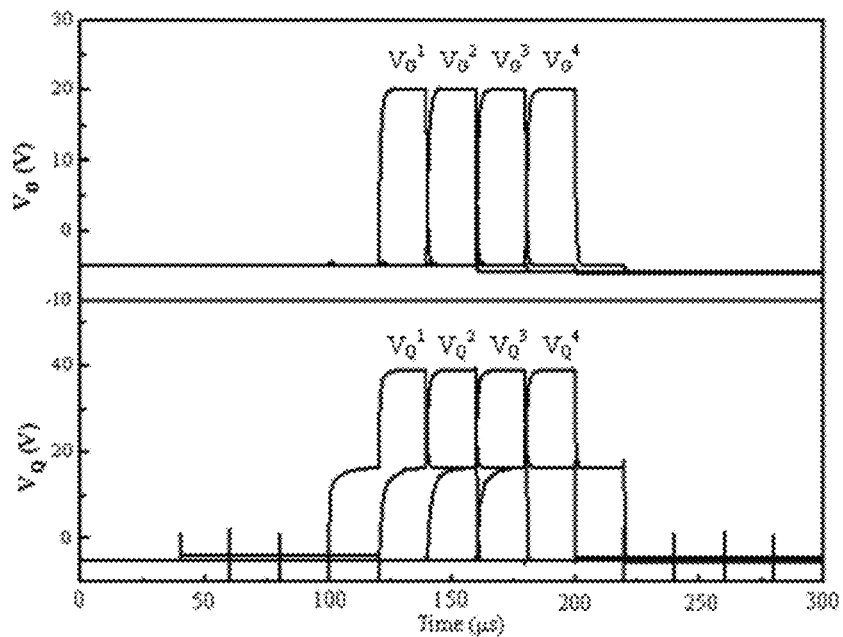
FIG. 12 is a schematic diagram of the simulated compensation results of fourth shift register.
Figure 13:
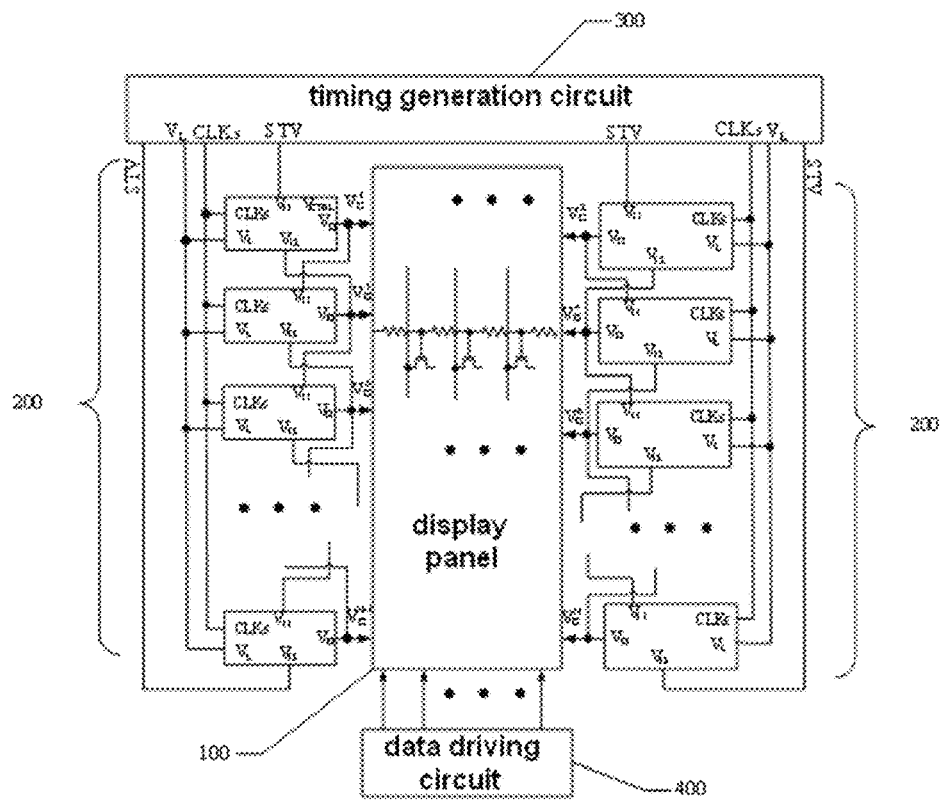
FIG. 13 is the structure diagram of the display apparatus of the fourth embodiment.
Figure 14:
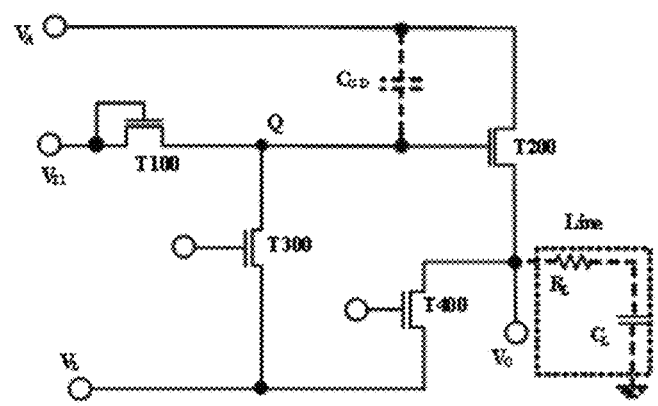
FIG. 14 is a basic structure diagram of the shift register unit with normal driving conditions.

A shift register unit is disclosed based on the above examples, the embodiment of the disclosure also discloses a shift register, please refer to FIG. 11, including multiple cascade shift register units SSC.

Multiple clock lines (CLK1, CLK2, CLK3 and CLK4) are used to transmit the required clock signal to each stages of shift-register units SSC.

The Start signal line STV is coupled to the first pulse signal input terminal of the first stage of shift-register unit SSC, and it is used to send start signal to start stage of the first shift-register to trigger operating of shift-register circuit.

Controllable voltage source, in a optimization embodiment, the clock signal required by the controllable voltage source is selectively coupled to the clock line CLK1, CLK2, CLK3 and/or CLK4 through the input terminal of the clock signal. The sensing terminal of the controllable voltage source is coupled to low level holding enable terminal P of the each stages of shift-register units SSC, and the second end is coupled to low level terminal of the shift register unit SSC at all levels. The signal output terminal of the controllable voltage source is coupled to the low-level holding enable terminal P of each stage of shift-register units, and the output voltage $V_{DD}$ of the adaptive voltage is used to provide the enable signal $V_P$ to the shift register units SSC at all levels.

In present embodiment, the controllable voltage source is shared by each stages of shift-register units, the rationality of this design is that: on the one hand, the uniformity of the amorphous thin film transistor is good, on the other hand, the low level holding transistor of the shift register units SSC experienced the same electrical stress conditions, so the threshold voltage shift value of the low level maintaining transistor of all levels of shift register units SSC is also highly consistent. Thus the threshold voltage $V_{TH}$ of the first level shift register unit SSC is only need to be extracted, and the rest each stages of shift-register units SSC are used the threshold voltage commonly. Thus the circuit structure is simplified, and the complexity of the circuit and the layout area are reduced. FIG. 10 shows the simulation results of the adaptive compensation effect to the shift registers. Among them, the horizontal axis is the time axis, and $V_G{}^n$ represents the output signal of the n level shift register unit SSC, which n is a positive integer. $V_Q{}^n$ is the potential of the control terminal of the n level shift register unit SSC. FIG. 10 proved the function of the adaptive voltage compensation shift register circuit normally.

A display is disclosed as show in FIG. 11, which includes the display panel 100. The display panel 100 includes a two-dimensional pixel array which may includes a plurality of two-dimensional pixels, a plurality of gate scanning lines and a plurality of data lines which are connected with each pixel in the first direction (i.e. horizontal) and the second direction (i.e. longitudinal) respectively. The same row of pixels in the pixel array is connected to the same gate scanning line while the same column of pixels is connected to the same data line. In addition, the display panel 100 can be a liquid crystal display panel, an organic light emitting display panel, an electronic paper display panel. But the corresponding display device can be liquid crystal display, organic light emitting display and electronic paper display and so on.

Gate driving circuit 200, in which the gate scanning signal output terminal of the gate drive unit circuit is coupled to gate scanning line of the display panel 100, and it is used for scanning pixel array progressively. The gate driving circuit 200 can be connected or integrated with the display panel 100 through the welding. The gate driving circuit 200 adopts the shift register provided by the embodiment. In a specific embodiment, the gate drive circuit 200 can be arranged on one side of the display panel 100. in an optimization embodiment, a pair of gate driving circuits 200 is used, and which is arranged on both sides of the display panel 100.

The data driving circuit 400 is used for generating the image data signal, which is outputted to corresponding data line of the display panel, and then it is transferred to the corresponding pixel unit by the data line to get the image gray.

Timing generation circuit 300 is used for generating varieties of control signals required by gate drive circuit 200.

The shift register has the following characteristics by adding a controllable voltage source.

(1) The gate bias of the traditional shift register circuit is constant. Due to the quick threshold voltage shift of the low level holding transistor, the circuits dose not work or have a short life. By adding the controllable voltage source, the threshold voltage shift of the low-level-holding transistors can be compensated adaptively. And the driving ability of the low-level-holding TFTs can be well maintained. Therefore the lifetime of the shift register is prolonged.

(2) According to the electrical characteristics of the amorphous thin film transistor, and the characteristic that the electrical stress state of the low level holding transistor of all levels shift register units is same. The shift register units at all levels share the controllable voltage source, which not only simplifies the circuit structure, but also reduce power consumption.

(3) The number of the external lead wires of the display module is greatly reduced through the disclosed shift register circuit, and the additional level line and the control line are not required. Compared to the conventional shift register circuit, the cost of the disclosed shift register circuit is decrease, and the reliability of the circuit is increased effectively.

The above application of specific example to explain the present disclosure, just to help understand the present disclosure which is not to limit the disclosure. For the general technical personnel in this field, according to the thought of the disclosure, the specific implementation of the above methods can be changed.

What is claimed is:
1. A controllable voltage source, comprising:
a control module, coupled between a high voltage level terminal and a low voltage level terminal;
a storage module comprising a storage capacitor, wherein two ends of the storage capacitor are coupled to the control module to form a first terminal and a second terminal;
an output module coupled to the second terminal, wherein a signal output terminal of the output module is configured to provide a controllable voltage source to an external circuit; and wherein the control module is configured to couple the first terminal to the high voltage level terminal in accordance with the effective voltage of a first clock signal φ1, and the first terminal is charged through the high voltage level terminal;
the control module is configured to couple the second terminal to the high voltage level terminal in accordance with the effective voltage of a second clock signal thus the second terminal is charged through the high voltage level terminal, and the first terminal is coupled to the low level voltage terminal and discharged through the low level voltage terminal; and
effective level periods of the first clock signal and effective level periods of the second clock signal do not overlap; and
further comprising a threshold modulation module,
wherein the threshold modulation module is coupled to the first terminal and the second terminal respectively, and the threshold modulation module is configured to couple to the low level terminal;
a sensing terminal of the threshold modulation module is configured to couple to an element to be sensed of the external circuit, and sense a threshold voltage of the element and feedback the threshold voltage to the first terminal and/or the second terminal.

2. The controllable voltage source of claim 1, wherein the control module comprises a first transistor a second transistor, and a third transistor;
   a first electrode of the first transistor and a first electrode of the second transistor are coupled to the high voltage level terminal;
   a second electrode of the first transistor and a second electrode of the second transistor are coupled to the storage capacitor to form the first terminal and the second terminal respectively;
   a control electrode of the first transistor is configured to receive the first clock signal;
   a control electrode of the second transistor is configured to receive the second clock signal.

3. The controllable voltage source of claim 1, wherein the output module comprises a sixth transistor, a first electrode and a control electrode of the sixth transistor are coupled and connected with the second terminal, a second electrode of the sixth transistor forms the signal output terminal of the output module.

4. The controllable voltage source of claim 3, wherein the output module further comprises a filter capacitor, and one end of the filter capacitor is coupled with the second electrode of the six transistor and the other end of the filter capacitor is coupled with the low voltage level terminal.

5. The controllable voltage source of claim 1, wherein the output module further comprises a seventh transistor;
   a first electrode of the seventh transistor is coupled to the signal output terminal of the output module; a second electrode of the seventh transistor is coupled with the low voltage level terminal; a control electrode of the seventh transistor is configured to receive a pull-down control signal;
   the seventh transistor is configured to couple the signal output terminal of the output module to the low voltage level terminal in accordance with effective voltage of the pull-down control signal.

6. The controllable voltage source of claim 1, wherein the threshold modulation module comprises a fourth transistor and a fifth transistor;
   a first electrode of the fourth transistor is coupled to the first terminal and a second electrode of the fourth transistor is configured to couple to the low voltage level terminal;
   a first electrode of the fifth transistor is coupled to the second terminal, and a second electrode of the fifth transistor is configured to couple to the low voltage level terminal;
   a control electrode of the fourth transistor and a control electrode of the fifth transistor are coupled to form the sensing terminal.

7. A shift register, comprising:
at least one shift register unit comprising:
a driving module configured to transmit a first signal to a signal output terminal of the shift register unit in accordance with a switching state, and output a scanning signal;
an input module configured to control the driving module to switch states; and
a low level holding module configured to maintain a signal output of the driving module at a low level after the shift register unit outputs the scanning signal in accordance with the switching state; and
a controllable voltage source of claim 1, wherein an output terminal of the controllable voltage source is coupled with an enable terminal of the low-level-holding module,
the controllable voltage source adjusts the supplied voltage to the enable terminal of the low-level-holding module.

8. The shift register of claim 7, wherein
the sensing terminal of the threshold modulation module is coupled to the enable terminal of the low-level-holding module;
the controllable voltage source senses the threshold voltage of the low-level-holding module, and adjust the supplied voltage to the enable terminal of the low-level-holding module.

9. A display device, comprising:
a two dimensional pixel array comprising a plurality of pixels, wherein a plurality of data lines in a first direction and a plurality of gate scanning lines in a second direction are connected to all pixels in the array;
a data driving circuit configured to provide data signals for data line;
a gate driving circuit configured to provide gate driving signal for the gate scan line;
wherein the gate driving circuit is composed of the shift register of claim 7.

* * * * *